United States Patent
Xing et al.

(10) Patent No.: US 11,069,659 B2
(45) Date of Patent: Jul. 20, 2021

(54) SEMICONDUCTOR DEVICE WITH DIE-SKIPPING WIRE BONDS

(71) Applicant: Western Digital Technologies, Inc., San Jose, CA (US)

(72) Inventors: Xinzhi Xing, San Jose, CA (US); John T. Contreras, Palo Alto, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 27 days.

(21) Appl. No.: 16/143,102

(22) Filed: Sep. 26, 2018

(65) Prior Publication Data

US 2020/0098728 A1    Mar. 26, 2020

(51) Int. Cl.
*H01L 25/065*    (2006.01)
*H01L 23/00*    (2006.01)

(52) U.S. Cl.
CPC .......... *H01L 25/0657* (2013.01); *H01L 24/09* (2013.01); *H01L 24/48* (2013.01); *H01L 2224/04042* (2013.01); *H01L 2224/48147* (2013.01); *H01L 2224/48227* (2013.01); *H01L 2224/49431* (2013.01); *H01L 2225/0651* (2013.01); *H01L 2225/06506* (2013.01); *H01L 2225/06562* (2013.01)

(58) Field of Classification Search
None
See application file for complete search history.

(56) References Cited

U.S. PATENT DOCUMENTS

| 2007/0035900 | A1* | 2/2007 | Huber | G06F 30/39 361/56 |
| 2014/0008796 | A1* | 1/2014 | Choi | H01L 23/5221 257/738 |
| 2014/0218998 | A1* | 8/2014 | Park | G11C 5/063 365/63 |
| 2015/0061157 | A1* | 3/2015 | Yu | H01L 25/50 257/777 |

FOREIGN PATENT DOCUMENTS

| JP | 4921937 | 6/2008 |
| JP | 2011049412 | 3/2011 |

* cited by examiner

*Primary Examiner* — Anthony Ho
*Assistant Examiner* — Kevin Quinto
(74) *Attorney, Agent, or Firm* — Vierra Magen Marcus LLP

(57) ABSTRACT

A semiconductor device is disclosed including a wire bonded die stack where the bond wires skip dies in the die stack to provide bond wires having a long length. In one example, the semiconductor dies are stacked on top of each other with offsets along two orthogonal axes so that the dies include odd numbered dies interspersed and staggered with respect to even numbered dies only one of the axes. Wire bonds may be formed between the odd numbered dies, skipping the even numbered dies, and wire bonds may be formed between the even numbered dies, skipping the odd numbered dies. The long length of the bond wires increases an inductance of the wire bonds relative to parasitic capacitance of the semiconductor dies, thereby increasing signal path bandwidth of the semiconductor device.

29 Claims, 13 Drawing Sheets

SEMICONDUCTOR DEVICE WITH DIE-SKIPPING WIRE BONDS

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

Semiconductor memory devices are often formed of a SiP(System in a Package) device including a number of memory dies mounted in an offset stack on a substrate. The semiconductor dies may be electrically coupled to each other and the substrate using wire bonds affixed to each die, cascading down the die stack. A shortcoming to such conventional wire bonded packages is that the bond wires used in today's stacked packages have low inductance as compared to the parasitic capacitance of the semiconductor dies. This large capacitance relative to inductance results in low signal bandwidth, on the order of hundreds of megahertz. This limitation in signal bandwidth in turn has drawbacks, including limiting the number of dies which can be wire bonded to each other and the substrate.

DETAILED DESCRIPTION

Figure 1:
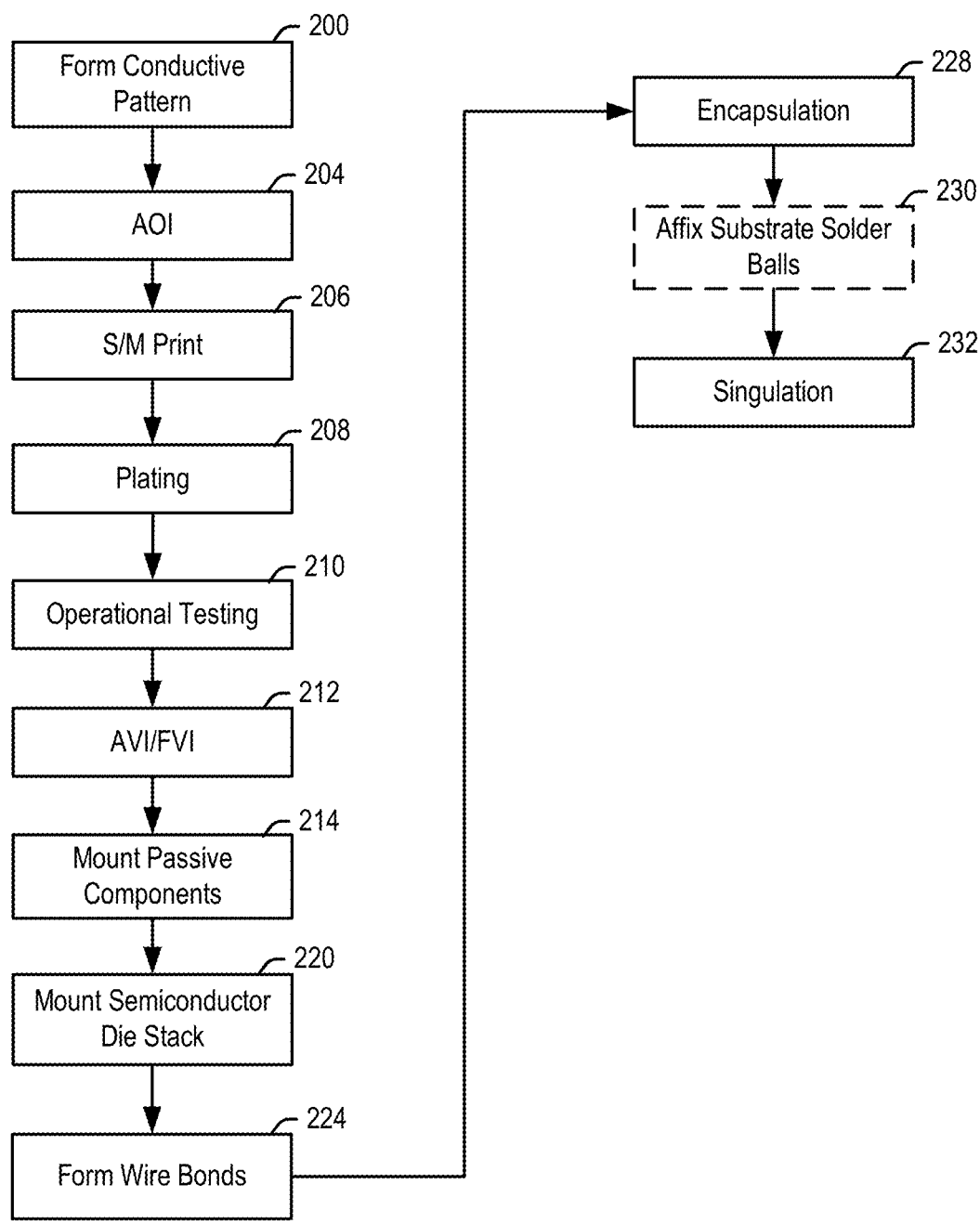
FIG. 1 is a flowchart for forming a semiconductor device according to embodiments of the present technology.

The present technology will now be described with reference to the figures, which in embodiments, relate to a semiconductor device including a wire bonded die stack where the bond wires skip dies in the die stack to provide bond wires having a long length. In one example, the semiconductor dies are stacked on top of each other with offsets along two orthogonal axes. The dies may be stacked with a continuous stepped offset in a first direction (e.g., along a y-axis) so that the die bond pads of die are exposed. The dies may also be stacked with an alternating stepped offset in a second direction (e.g., along an x-axis) so that odd numbered dies in the stack align with each other and even numbered dies in the stack align with each other.

Wire bonds may then be formed up the stack, connecting alternating (e.g., odd numbered)dies in the stack. The topmost two dies in the stack may be wire bonded to each other and wire bonds may then be formed down the stack, connecting alternating (e.g., even numbered)dies in the stack. The offset of the odd and even numbered dies along the x-axis allows two columns of bond wires to connect all corresponding die bond pads on each die. Using two columns of die-skipping wire bonds, each corresponding pin of the staggered dies in the stack are connected to each other and the substrate.

Moreover, as alternating dies are wire bonded to each other, the lengths of the bond wires are increased relative to conventional bond wires connected to each die in the stack. By increasing the length of the bond wires, inductance of the wire bond circuit is increased relative to parasitic capacitance, thereby increasing signal path bandwidth of the semiconductor device.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension.

An embodiment of the present technology will now be explained with reference to the flowchart of FIG. 1, and the perspective, top and edge views of FIGS. 2-21. Although the figures show an individual semiconductor device 100, or a portion thereof, it is understood that the device 100 may be batch processed along with a plurality of other semiconductor devices on substrate panels to achieve economies of scale. The number of rows and columns of devices 100 on the substrate panels may vary.

The substrate panel for the fabrication of semiconductor device 100 begins with a plurality of substrates 102 (again, one such substrate is shown in FIGS. 2-21). The substrate 102 may be a variety of different chip carrier mediums, including a printed circuit board (PCB), a leadframe or a tape automated bonded (TAB) tape. Where substrate 102 is a PCB, the substrate may be formed of a core sandwiched between a pair of conductive layers. The core may be formed of various dielectric materials such as for example, polyimide laminates, epoxy resins including FR4 and FR5, bismaleimide triazine (BT), and the like. The conductive layers may be formed of copper or copper alloys, plated copper or plated copper alloys, Alloy 42 (42Fe/58Ni), copper plated steel, or other metals and materials suitable for use on substrate panels.

Figure 2:
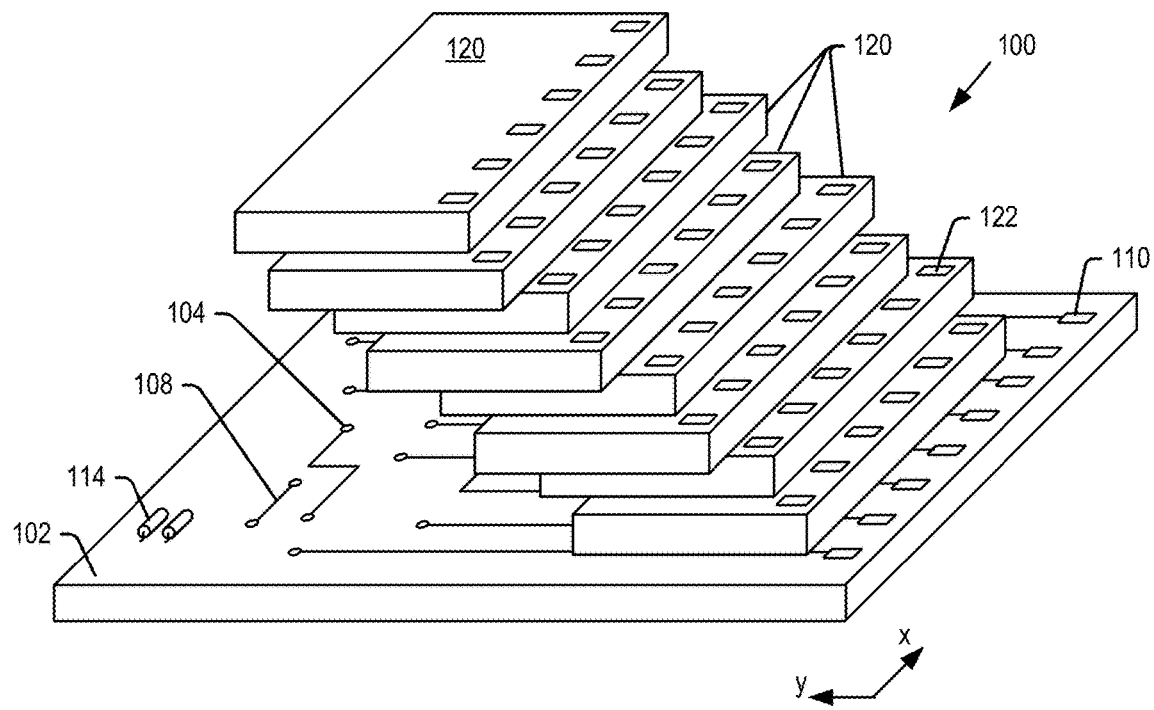
FIG. 2 is a perspective view of a stack of semiconductor die mounted on a substrate according to embodiments of the present technology.
Figure 15:
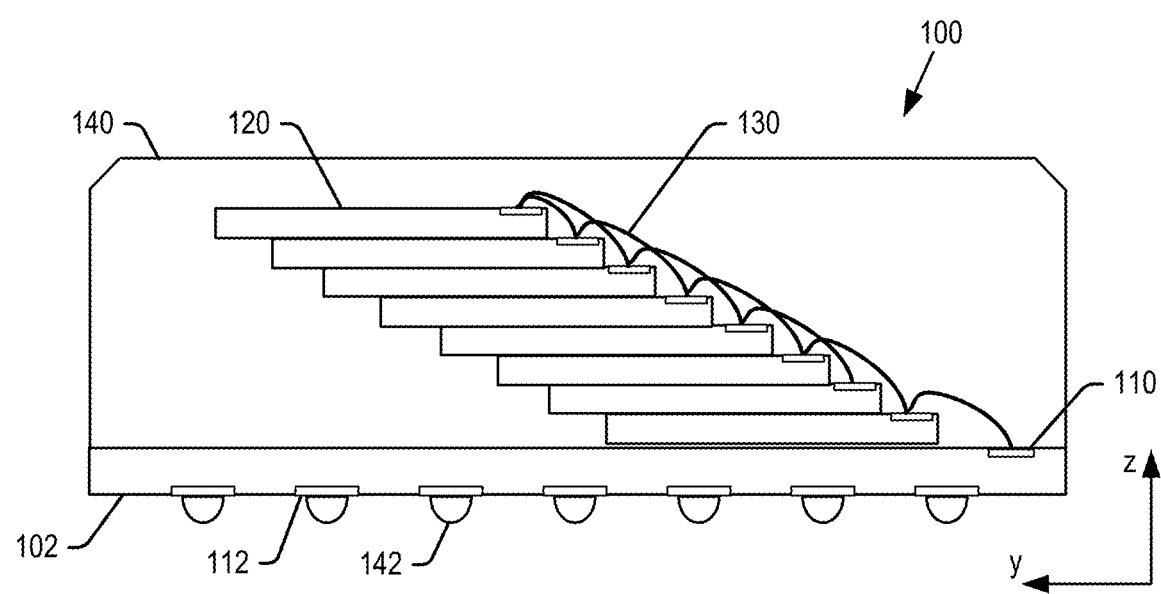
FIG. 15 is an edge view of a finished semiconductor package according to embodiments of the present technology.

A conductive pattern of vias, leads and/or pads may be formed in step 200 in and through the substrate 102. The substrate 102 may drilled to define through-hole vias, which are subsequently plated and/or filled with a conductive metal. A conductance pattern of electrical traces and contact pads may then be formed on the top and/or bottom major planar surfaces of substrate 102. FIG. 2 illustrates an example of vias 104 and a conductance pattern including traces 108 and contact pads 110 formed on a first major planar surface of substrate 102. FIG. 15 shows an example of contact pads 112 formed on a second major planar surface of substrate 102.

The pattern of vias 104, traces 108 and contact pads 110, 112 shown on the surfaces of substrate 102 are by way of example, and the substrate 102 may include more or less vias, traces and/or contact pads in further embodiments, and they may be in different locations in further embodiments. The conductance pattern on the top and/or bottom surfaces of the substrate 102 may be formed by a variety of known processes, including for example various photolithographic processes.

Referring again to FIG. 1, the substrate 102 may next be inspected in step 204. This step may include an automatic optical inspection (AOI). Once inspected, a solder mask may be applied to the upper and/or lower surfaces of the substrate 102 in step 206. After the solder mask is applied, the contact pads 110, and any other areas to be soldered on the conductance patterns may be plated, for example, with a Ni/Au, Alloy 42, or the like, in step 208 in a known electroplating or thin film deposition process. The substrate 102 may next undergo operational testing in step 210 to ensure the substrate 102 is working properly. In step 212, the substrate may be visually inspected, including for example an automated visual inspection (AVI) and a final visual inspection (FVI) to check for contamination, scratches and discoloration. One or more of these steps may be omitted or performed in a different order in further embodiments.

Assuming the substrate 102 passes inspection, passive components 114, shown for example in FIG. 2, may next be affixed to the substrate 102 in a step 214. The one or more passive components may include for example one or more capacitors, resistors and/or inductors, though other components are contemplated. The passive components are shown by way of example only.

Figure 3:
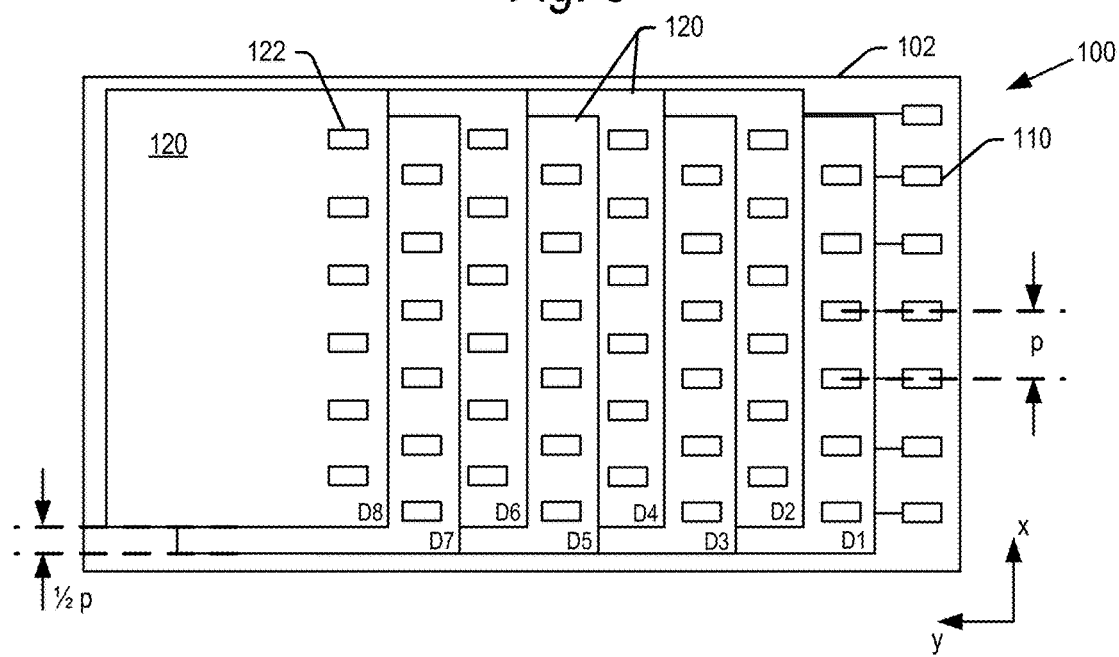
FIG. 3 is a top view of a stack of semiconductor die mounted on a substrate according to embodiments of the present technology.

In step 220, one or more semiconductor dies 120 may be mounted on the substrate 102, as shown in the perspective and top views of FIGS. 2 and 3. The semiconductor dies 120 may for example be memory dies such as 2D NAND flash memory or 3D BiCS(Bit Cost Scaling), V-NAND or other 3D flash memory, but other types of dies 120 may be used. These other types of semiconductor dies include but are not limited to controller dies such as an ASIC, or RAM such as an SDRAM, DDR SDRAM, LPDDR and GDDR.

Each die may include a number of die bond pads 122 along an edge of the semiconductor die (in the x-direction). Each die bond pad is referred to herein as a channel, with a first die bond pad (bottommost in FIG. 3) on each die arbitrarily referred to as the first channel, a second die bond pad (second from the bottom in FIG. 3) on each die arbitrarily referred to herein as the second channel, and so on for the remainder of the die bond pads 122 on the semiconductor dies 120. In embodiments explained below, each of the first channel die bond pads on all dies may be connected to each other and the substrate 102, each of the second channel die bond pads on all dies may be connected to each other and the substrate, and so on across the die bond pads 122 of dies 120.

In accordance with aspects of the present technology, the semiconductor dies 120 may be stacked on the substrate 102 offset from each other along two orthogonal axes, arbitrarily labeled the x and y axes in the figures. For example, the semiconductor dies 120 may be stacked atop each other, each with a positive offset along the y-axis to form a stepped die stack in the y-direction as shown for example in FIGS. 2 and 3. In embodiments, each of the dies 120 (also labeled dies D1-D8 in the figures) are offset along the y-axis the same amount. The offset along the y-axis is sufficient to leave the die bond pads 122 on each die uncovered and exposed for wire bonding as explained below.

The dies 120 may also be stacked atop each other with alternating positive and negative offsets along the x-axis to form a die stack of odd and even numbered dies interspersed and staggered with respect to each other in the x-direction as shown for example in FIGS. 2 and 3. The dies 120 may be staggered along the x-direction so that each of the odd dies (dies D1, D3, D5 and D7 in FIGS. 2 and 3) may align with each other and a contact pad 110 on substrate 102 along the x-direction. Each of the even dies (dies D2, D4, D6 and D8 in FIGS. 2 and 3) may align with each other along the x-direction. In embodiments, each contact pad 110 and die bond pad 122 may be spaced from each adjacent die bond pad by a pitch, p, as shown in FIG. 3. In embodiments, the pitch, p, may be 120 μm, but the pitch may be greater or lesser than that in further embodiments. The odd dies 120 may be staggered with respect to the even dies 120 along the x-axis by a distance equal to ½ p=60 μm. With this spacing, each die bond pad 122 on the even dies lies directly between each pair of die bond pads 122 on the odd dies, and vice-versa. It is understood that the odd and even dies 120 may be staggered by a distance other than ½ of the pitch between bond pads 122 in further embodiments.

The number of dies 120 shown in the stack is by way of example only. It is in fact a feature of the present technology to provide a large signal bandwidth to the die stack that enables large numbers of dies 120 in the die stack, including for example 8, 16, 32 or 64 dies. There may be 4 or other numbers of dies in further embodiments. The dies may be affixed to the substrate and/or each other using a die attach film. As one example, the die attach film may be cured to a B-stage to preliminarily affix the dies 120 in the stack, and subsequently cured to a final C-stage to permanently affix the dies 120 to the substrate 102.

Figure 4:
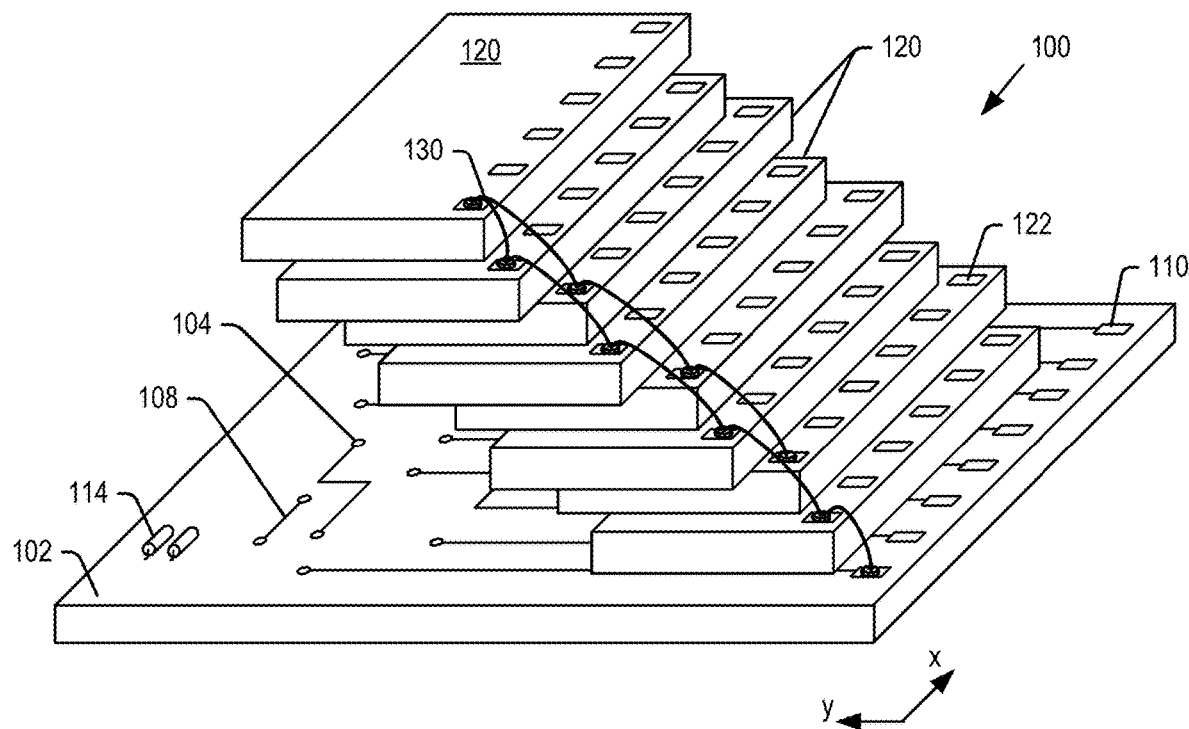
FIG. 4 is a perspective view of a first group of wire bonds formed on a stack of semiconductor die according to embodiments of the present technology.
Figure 5:
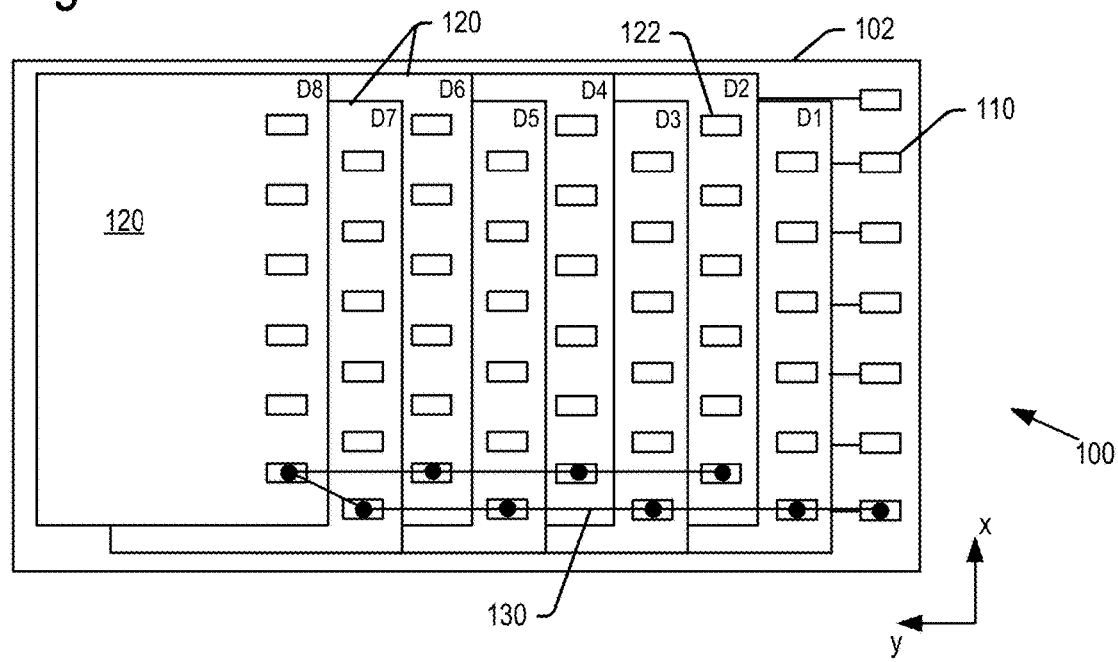
FIG. 5 is a top view of a first group of wire bonds formed on a stack of semiconductor die according to embodiments of the present technology.

In step 224, the semiconductor dies 120 may be electrically interconnected to each other and to the substrate 102 using wire bonds. FIGS. 4 and 5 shows perspective and top views of a first group of bond wires 130 formed between the first channel die bond pads on respective dies 120. In accordance with one aspect of the present technology, bond wires 130 may be bonded to dies on alternating levels, using two columns of bond wires to connect the first channel die bond pads 122 (e.g., bottommost in FIG. 5) for all semiconductor dies 120 in the stack. In one example shown in FIGS. 4 and 5, wire bonds may be formed between the substrate 102 and die D1. Wire bonds may also be formed extending between each of the odd dies D1, D3, D5 and D7 (skipping the even dies). Wire bonds may further be formed extending between each of the even dies D2, D4, D6 and D8 (skipping the odd dies). A wire bond may also be formed between the two uppermost dies, D7 and D8 in this example. The result is that the first channel die bond pads of each die are wire bonded to each other, skipping die levels and using two columns of bond wires 130. As used herein, a bond wire "extending between" first and second dies means that the bond wire has a first portion bonded to the first die and a second portion bonded to the second die, there being no contact of the bond wire with a die between the first and second portions.

The wire bonds described above may be formed using a variety of wire bond techniques. In one example, a wire bond capillary (not shown) may initially form a ball on contact pad 110 of substrate 102 using heat, ultrasonic energy and/or pressure. The capillary may then pay out wire and form a wedge bond on the first channel die bond pad 122 of die D1, again using heat, ultrasonic energy and/or pressure. The capillary may then form a ball bond on the first die bond pad 122 of die D1 and then pay out wire and form a wedge bond on the first die bond pad 122 of die D3. The same process may continue up the die stack, forming ball bonds and wedge bonds between dies D3 and D5, dies D5 and D7, and finally, dies D7 and D8 (in a single die jump). The capillary may then move down to the first die bond pad of die D2, form a ball bond, and then pay out wire and form a wedge bond on the first channel die bond pad 122 of die D4. The capillary may then continue up the die stack, forming ball bonds and wedge bonds between dies D4 and D6, and dies D6 and D8 to complete the two columns of wire bonds.

It is understood that the wire bonds, skipping dies and formed in two columns, may be made using other types of wire bonds, by other methods and/or in other orders in further embodiments. For example, it is possible that the wire bonds are made up the stack, U-turn at the top and then made down the stack. Moreover, in the above embodiment, the first channel die bond pads of each of the dies were wire bonded together (proceeding in the y-direction) before bond wires were applied to any of the second channel, third channel, etc. die bond pads across the die stack. In a further embodiment, all wire bonds between the substrate 102 and all of the bond pads 122 of the first die D1 may be made (proceeding in the x-direction). Once all bonds are formed between the substrate and D1, all wire bonds from D1 may be made to the next die(s), and so on across and up the die stack.

In embodiments, the wire used for bond wires 130 may be formed of gold, but may be made of other materials including for example aluminum, copper or other metals and alloys. The diameter of the wire may be from 0.7 mils to 2.0 mils, though the wire diameter may be thinner or thicker than that in further embodiments.

In the embodiment of FIGS. 4 and 5, given the staggered offset of the dies 120 along the x-axis, the first channels on alternating levels of dies may be wire bonded to each other with bond wires that proceed straight up the die stack along the y-axis. Given the staggered offset of ½ the pitch between die bond pads, the spacing between the first and second columns of bond wires may be maximized. This minimizes the chances of bond wires in the respective columns from shorting together.

In the embodiment of FIGS. 4-5, the dies 120 are stacked such that the die bond pad of the odd dies are aligned with their corresponding contact pad 110 on the substrate 102, and the even dies are staggered by a distance+½ p along the x-axis. In an alternative embodiment, the dies 120 may be stacked such that the die bond pads of the odd dies are aligned with their corresponding contact pad 110 on the substrate 102, and the even dies are staggered by a distance−½ p along the x-axis. As noted, the dies may be staggered a distance which is greater or lesser than ½ p in further embodiments.

Figure 6:
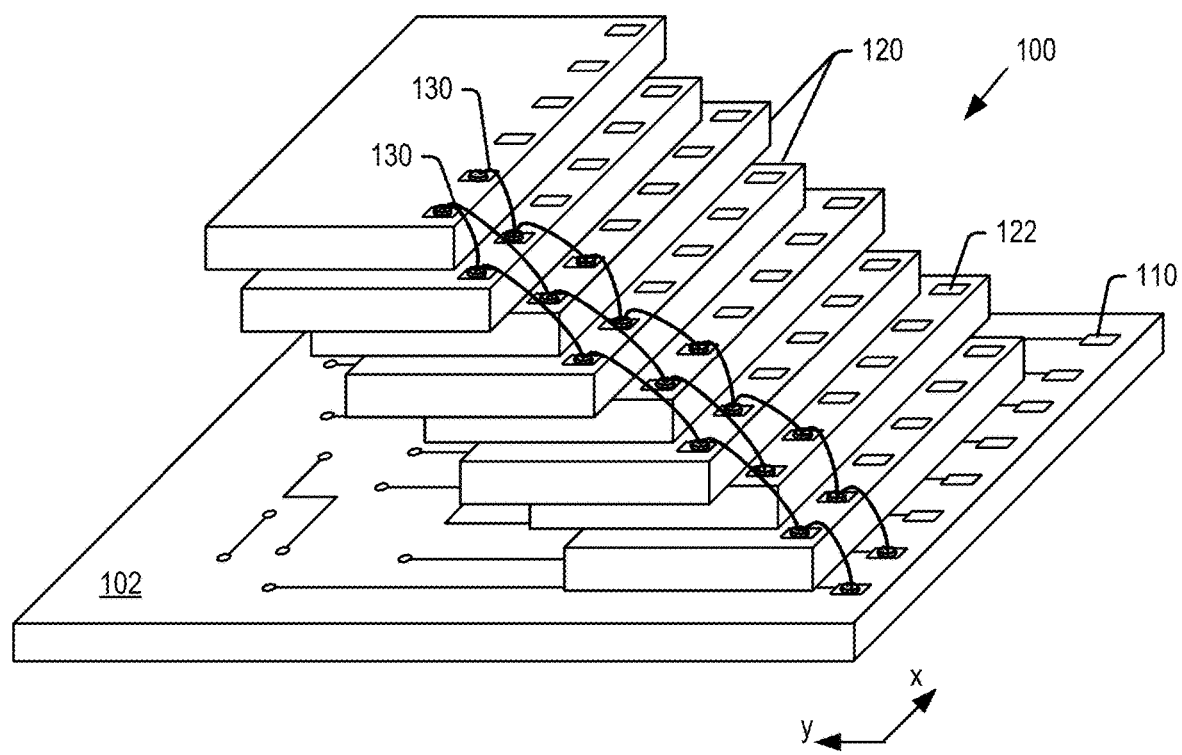
FIG. 6 is a perspective view of first and second groups of wire bonds formed on a stack of semiconductor die according to embodiments of the present technology.
Figure 7:
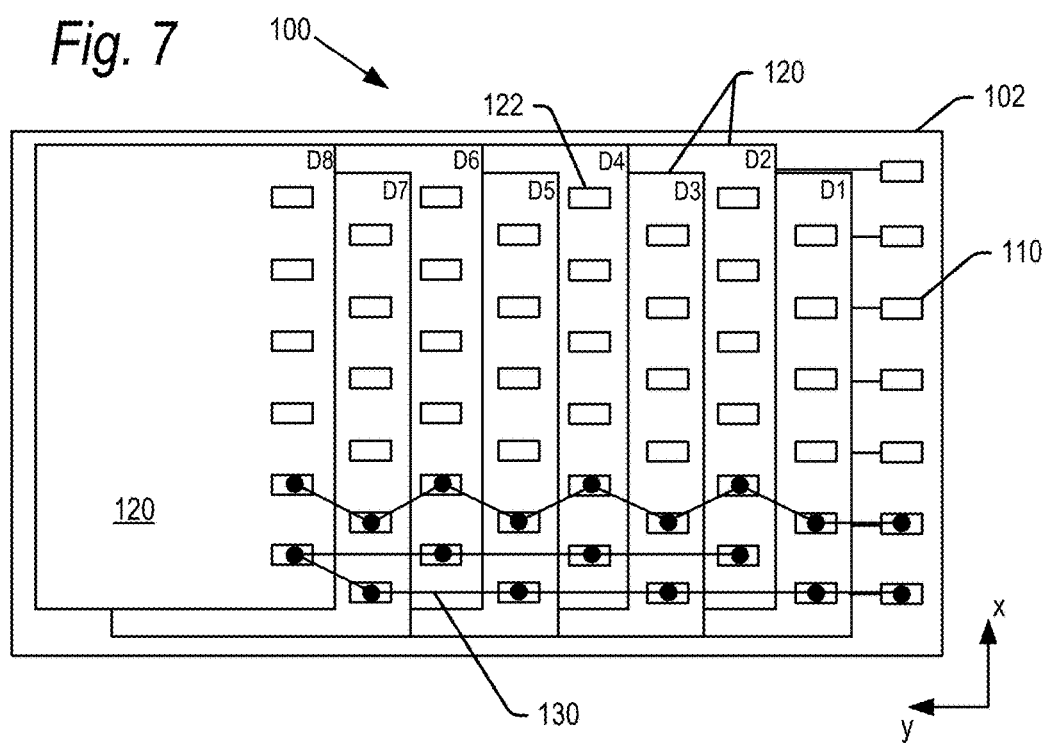
FIG. 7 is a top view of first and second groups of wire bonds formed on a stack of semiconductor die according to embodiments of the present technology.

In the embodiment of FIGS. 4 and 5, the first channel die bond pads 122 may be connected to a data signal pin on the substrate so that data signals are carried to/from the first channel die bond pads 122 on the semiconductor dies 120 in the die stack. For channels that carry data signals, wire bonds may be formed skipping die levels as explained above. However, where a die bond pad is other than a data signal-carrying channel, wire bonds may be formed without skipping die levels. For example, FIGS. 6 and 7 are perspective and top views of wire bonds formed on the second channel die bond pads 122 of each of the dies 120. In this example, the second channel die bond pad 122 of each die 120 may be a power or ground channel. As noted, in this case, wire bonds may be formed to each level, without skipping dies. Given the staggered offset of the dies, the wire bonds may be formed in a single column with a zigzag pattern, connecting each of the second channel die bond pads to each other between immediately adjacent odd and even dies 120.

As above, in one example of FIGS. 6 and 7, a wire bond capillary may form a ball on the second contact pad 110 of substrate 102 using heat, ultrasonic energy and/or pressure. The capillary may then pay out wire and form a wedge bond on the second die bond pad 122 of die D1, again using heat, ultrasonic energy and/or pressure. The capillary may then form a ball bond on the first die bond pad 122 of die D1 and then pay out wire and form a wedge bond on the second die bond pad 122 of die D2. The same process may continue up the die stack, forming ball bonds and single jump wedge bonds in a zigzag pattern successively between dies D2, D3, D4, D5, D6, D7 and D8. It is understood that the wire bonds between the second die bond pads of each die 120 may be made by other types of wire bonds and by other methods in further embodiments.

Figure 8:
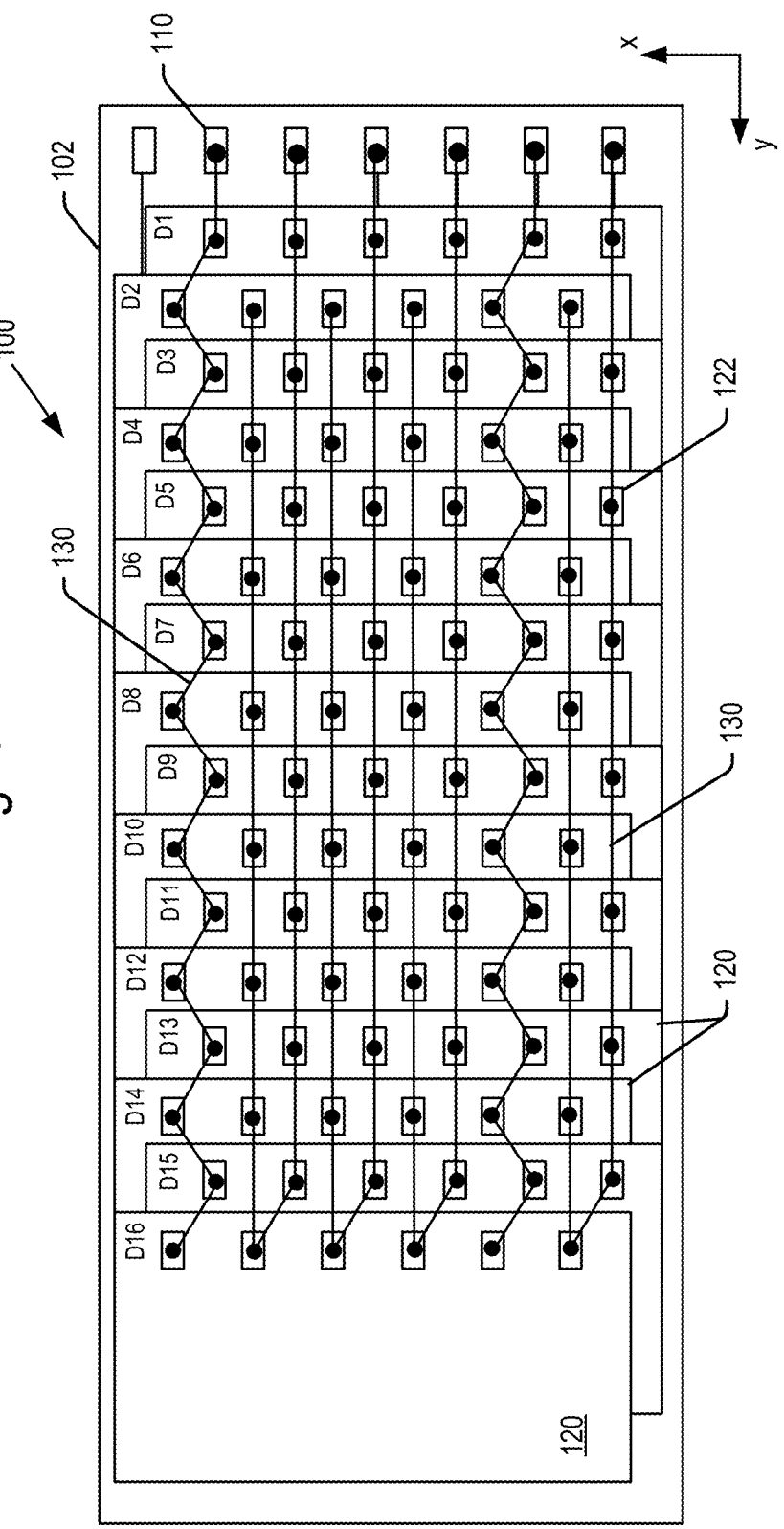
FIG. 8 is a top view of wire bonds on all die bond pads of stack of semiconductor die according to embodiments of the present technology.

FIG. 8 is a top view of a die stack including 16 dies 120 (D1-D16), with all of the same channel bond pads 122 wire bonded to each other and the substrate 102 in accordance with the above-described embodiments. FIG. 8 shows four data-carrying channels, wire bonded with die skipping bond wires 130 in two columns. FIG. 8 also shows two power/ground channels (the second and last), wire bonded with bond wires 130 in a zigzag pattern and with no die skipping wire bonds. These channels, and (as noted above) the number of die bond pads 122 on each die, are illustrated for explanation purposes, and may vary in further embodiments.

Figure 9:
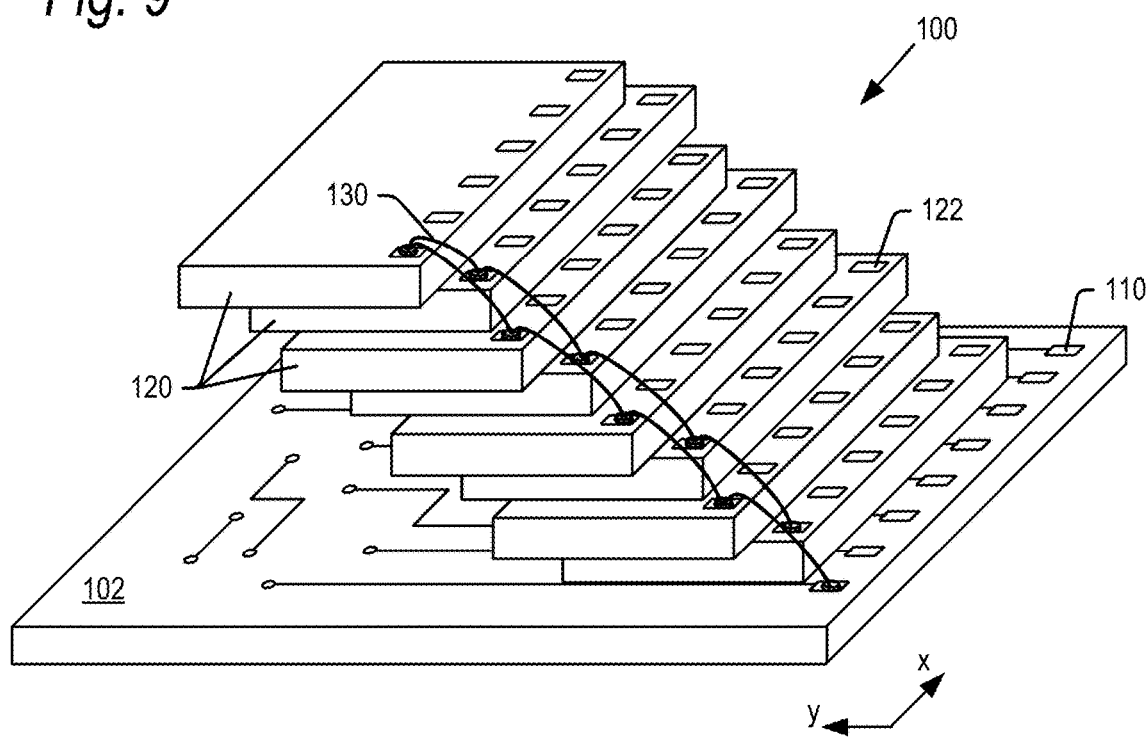
FIG. 9 is a perspective view of a group of wire bonds formed on a stack of semiconductor die according to alternative embodiments of the present technology.
Figure 10:
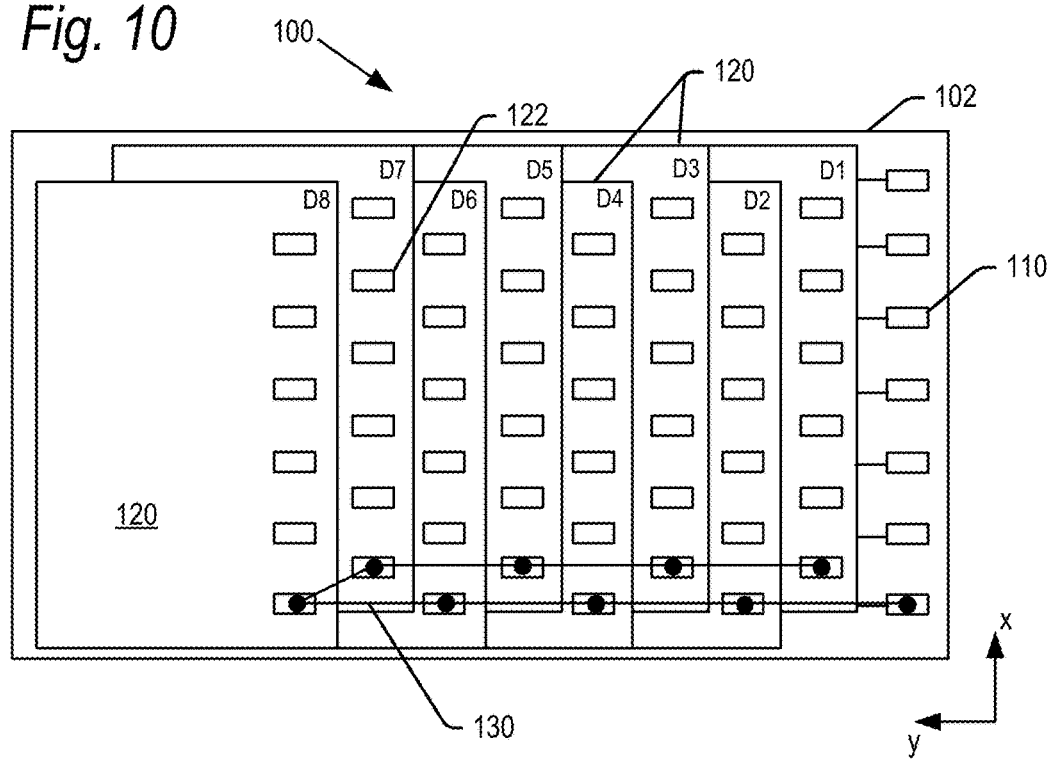
FIG. 10 is a top view of a group of wire bonds formed on a stack of semiconductor die according to alternative embodiments of the present technology.
Figure 11:
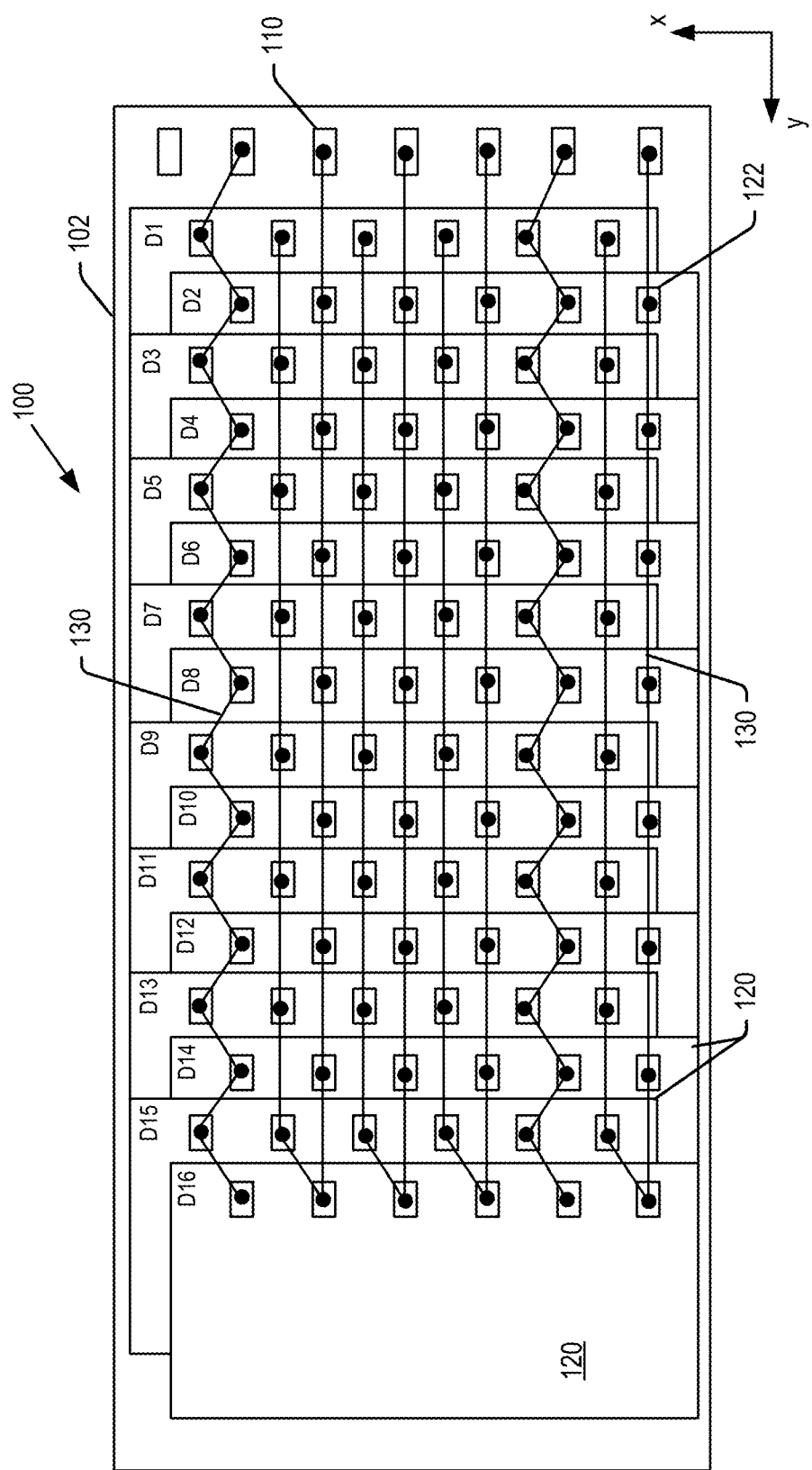
FIG. 11 is a top view of wire bonds on all die bond pads of stack of semiconductor die according to alternative embodiments of the present technology.

In the embodiments shown in FIGS. 6-8, the substrate 102 was wire bonded to die D1. In a further embodiment shown in the perspective and top views of FIGS. 9-11, the substrate 102 may be wire bonded to die D2, skipping die D1. In the embodiment of FIGS. 6-8, the dies 120 are stacked such that the die bond pads of the even dies are aligned with their corresponding contact pad 110 on the substrate 102, and the odd dies are staggered by a distance+½ p along the x-axis. In the embodiment of FIGS. 9-11, the dies 120 may alternatively be stacked such that the die bond pads of the even dies are aligned with their corresponding contact pad 110 on the substrate 102, and the odd dies are staggered by a distance−½ p along the x-axis. The dies 120 may be staggered a distance which is greater or lesser than ½ p in further embodiments.

FIGS. 9 and 10 are perspective and top views, respectively, showing an embodiment including 8 semiconductor dies 120. The substrate 102 is wire bonded to die D2, and the even dies D2, D4, D6 and D8 are wire bonded to each other. The odd dies D1-D7 are wire bonded to each other, and the uppermost dies D7 and D8 are wire bonded to each other. FIG. 11 is a top view of a die stack including 16 dies 120 (D1-D16), with all die bond pads 122 wire bonded to each other and the substrate 102 in accordance with the embodiment of FIGS. 9-10. FIG. 11 shows data-carrying channels, wire bonded with die skipping bond wires 130 in two columns, and power/ground channels wire bonded with bond wires 130 in a zigzag pattern and with no die skipping wire bonds. Any of the above-described techniques for forming the wire bonds may be used.

Figure 12:
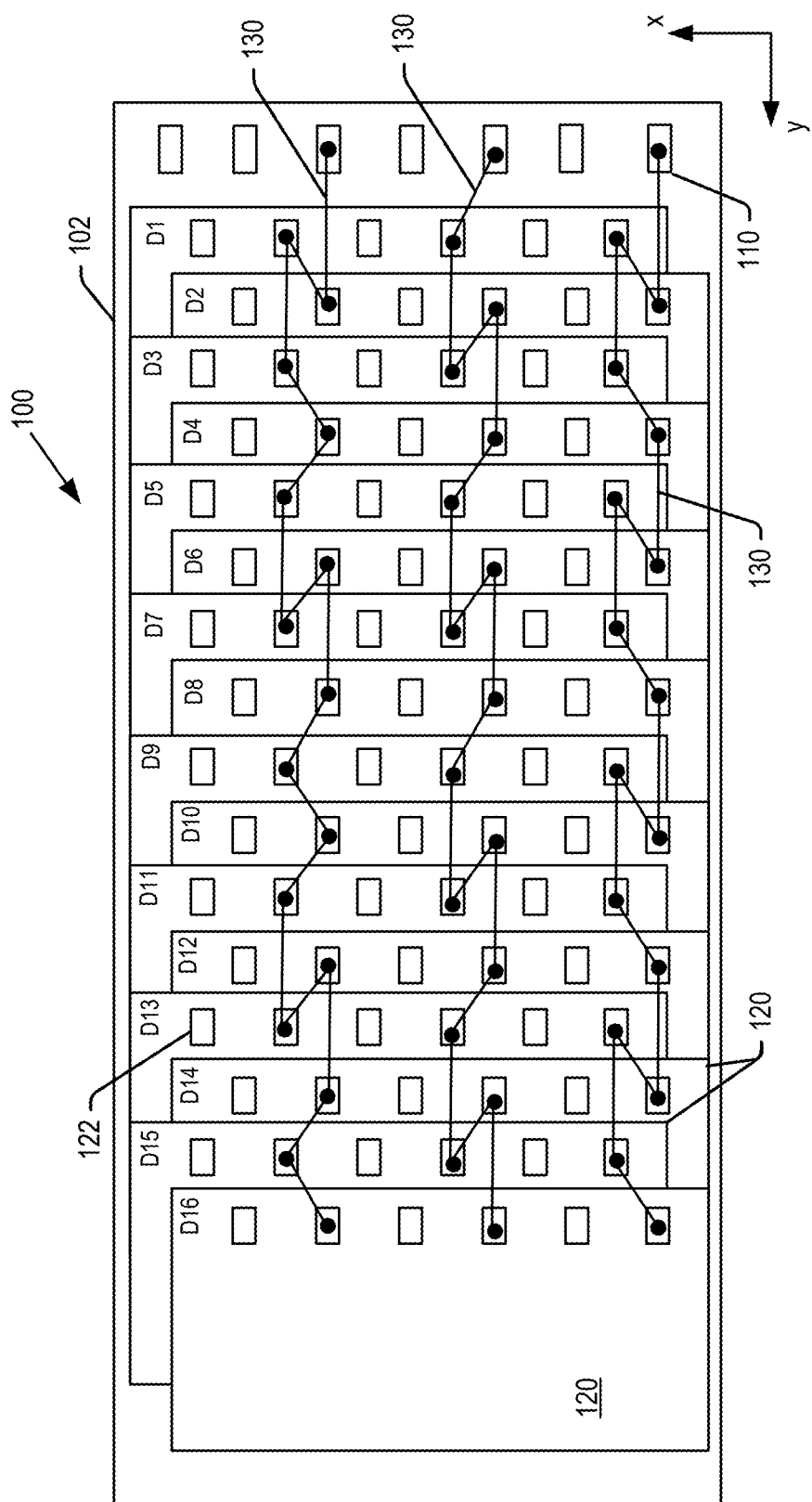
FIG. 12 is a top view of wire bonds on die bond pads of stack of semiconductor die according to a further alternative embodiment of the present technology.

In the embodiments described above, die bond pads of the same signal carrying channel may be connected to each other using bond wires 130 that extend in two straight columns up/down the die stack, skipping levels. In further embodiments, die bond pads of the same signal carrying channel may be connected using bond wires 130 where some extend in a straight line up the die stack, skipping levels, and others extend diagonally up or down the die stack, not skipping levels. The top view of FIG. 12 shows a few different examples of wiring schemes according to this embodiment using a 16 die stack. In the first (bottommost) example, the bond wires 130 connecting first channel die bond pads 122 are formed such that they follow a repeating pattern of extending straight up two dies, diagonally back one die, straight up two dies, diagonally forward one die. So in the first example, the bond wires 130 are connected between the following dies: Substrate to D2, D2 to D1, D1 to D3, D3 to D4, D4 to D6, D6 to D5, D5 to D7, D7 to D8, D8 to D10, D10 to D9, D9 to D11, D11 to D12, D12 to D14, D14 to D13, D13 to D15, and D15 to D16.

In the second (middle) example, the bond wires 130 connecting third channel die bond pads 122 are formed such that they follow a repeating pattern of extending diagonally forward one die, straight up two dies, diagonally back one die, straight up two dies. So in the second example, the bond wires 130 are connected between the following dies: Substrate to D1, D1 to D3, D3 to D2, D2 to D4, D4 to D5, D5 to D7, D7 to D6, D6 to D8, D8 to D9, D9 to D11, D11 to D10, D10 to D12, D12 to D13, D13 to D15, D15 to D14 and D14 to D16.

In the third (topmost) example, the bond wires 130 connecting fifth channel die bond pads 122 are formed such that they do not follow a repeating pattern, but extend either straight up to dies or diagonally forward or back one die. While there are a wide variety of possibilities for this example, in what is shown, the bond wires 130 are connected between the following dies: Substrate to D2, D2 to D1, D1 to D3, D3 to D4, D4 to D5, D5 to D7, D7 to D6, D6 to D8, D8 to D9, D9 to D10, D10 to D11, D11 to D13, D13 to D12, D12 to D14, D14 to D15, D15 to D16.

The examples of FIG. 12 share the property of wire bonds which bond straight up skipping a die, and wire bonds which bond diagonally not skipping a die. The examples of FIG. 12 also share the property that all dies 120 may be wire bonded in a single pass from the substrate up to the uppermost die, or vice-versa.

Figure 13:
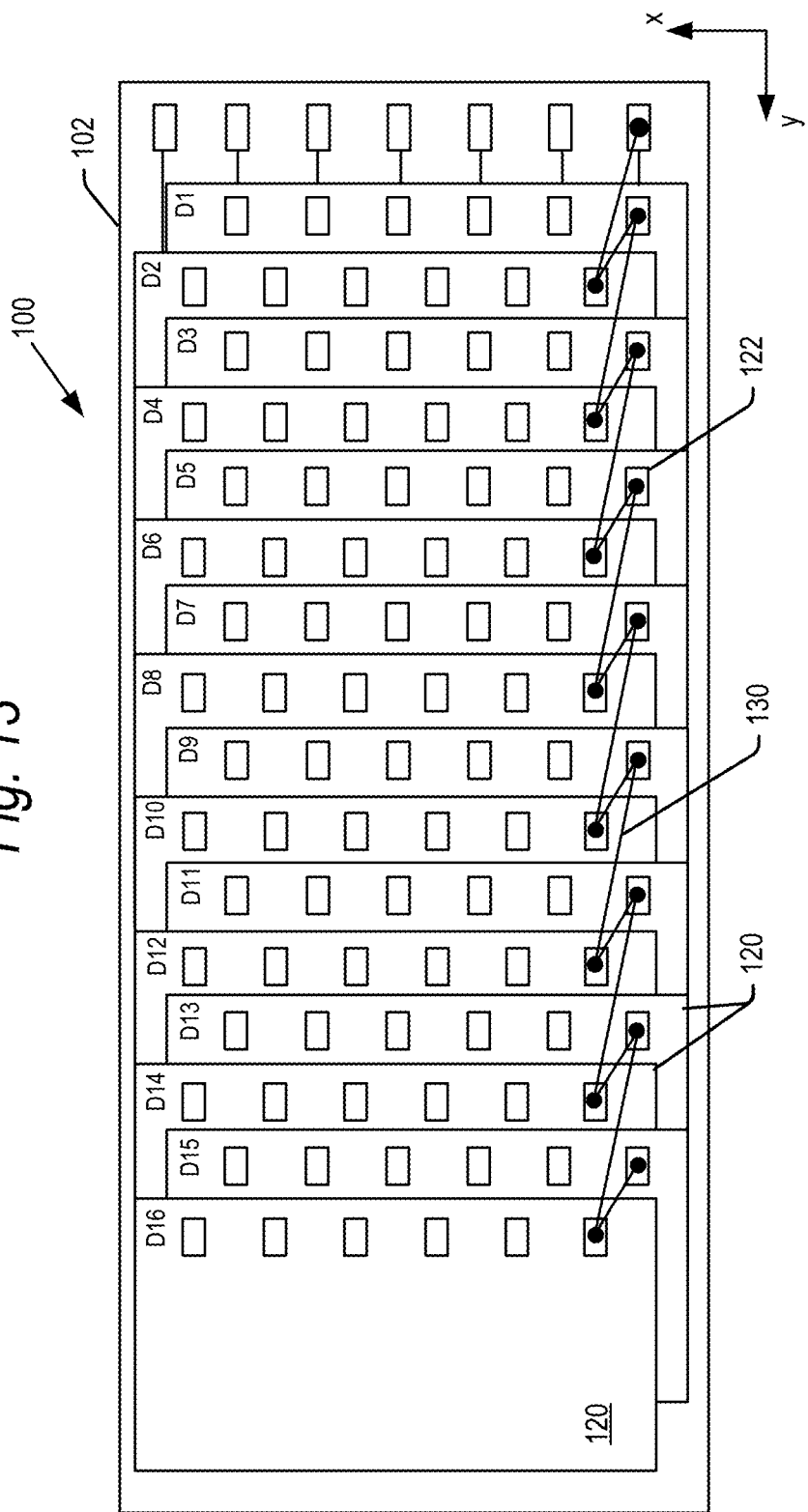
FIG. 13 is a top view of wire bonds on die bond pads of stack of semiconductor die according to another alternative embodiment of the present technology.

In the embodiments described above, a bond wire 130 may skip one die 120. However, in further embodiments, a bond wire may skip more than one die 120, including for example skipping 2 or more dies 120. FIG. 13 illustrates a 16-die embodiment where wire bonds connecting first channel die bond pads 122 are formed that skip 2 dies. The first contact pad 110 of substrate 102 may be wire bonded to the first channel contact pad of die D2. Die D2 may be wire bonded back to die D1. The wire bonds may then continue skipping two dies up and then one back: die D1 to die D4, die D4 to die D3, die D3 to die D6, die D6 to die D5, die D5 to die D8, die D8 to die D7, die D7 to die D10, die D10 to die D9, die D9 to die D12, die D12 to die D11, die D11 to die D14, die D14 to die D13, die D13 to die D16, and finally, die D16 to die D15.

Figure 14:
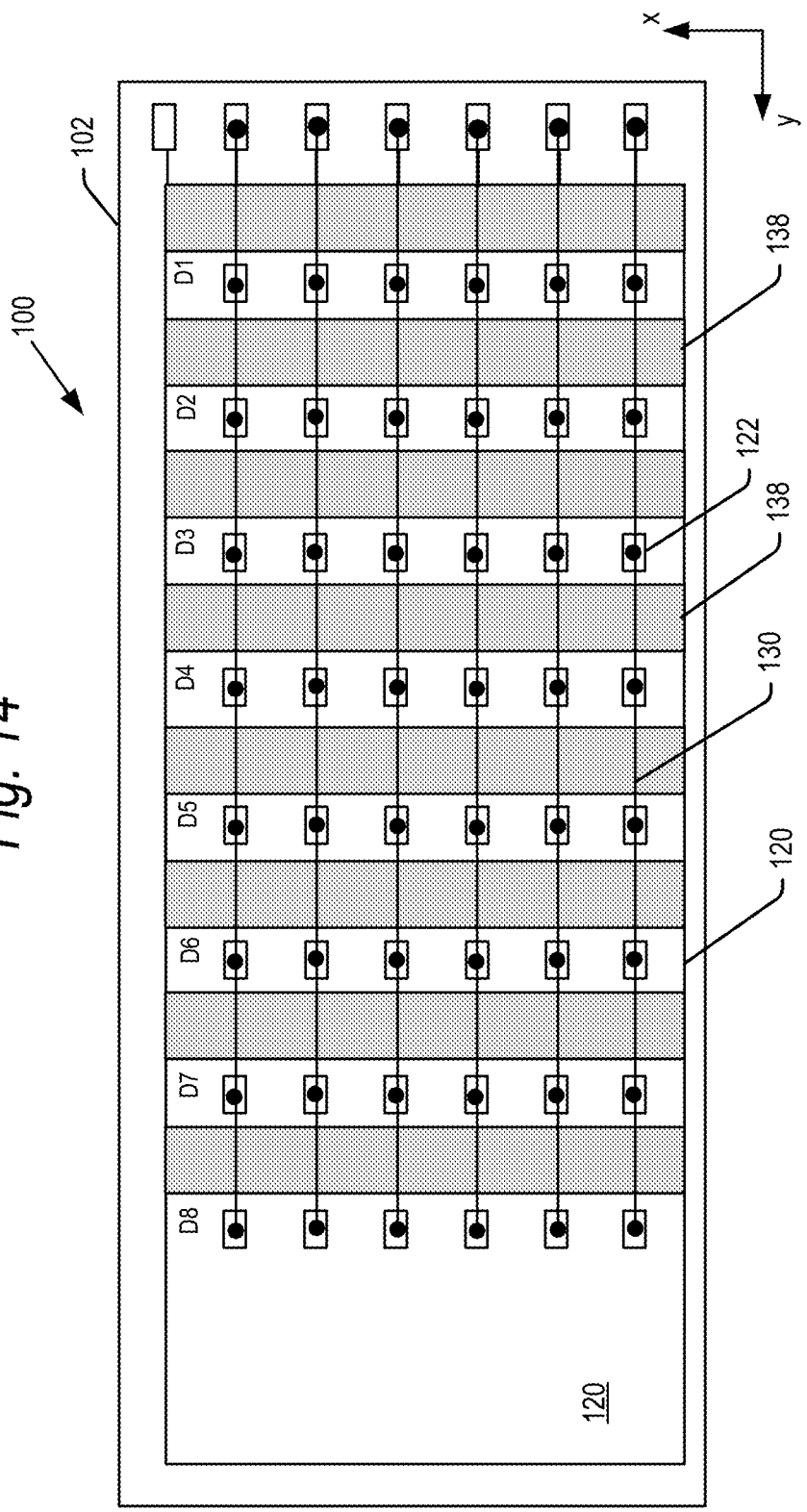
FIG. 14 is a top view of wire bonds on die bond pads of stack of semiconductor die according to a further alternative embodiment of the present technology.

It is a feature of the present technology that signal path bandwidth may be improved as explained below without adding structure or circuitry to an otherwise conventional semiconductor package. However, in a further embodiment shown in FIG. 14, inductance may be increased and signal path bandwidth may be improved by adding additional structure in the form of dummy spacer layers 138. In this embodiment, spacer layers may be provided within the die stack, alternating with the semiconductor dies 120. In this embodiment, the semiconductor dies 120 may be mounted with the spacer layers with no offset along the x-axis, and the respective channels on the dies 120 in the stack may be bonded straight up the stack as shown in FIG. 14. The spacer layers 138 increase the distance between semiconductor dies 120 in the stack, thus requiring longer bond wires 130 to wire bond the stack.

The length of the bond wires 130 may be controlled by controlling the thickness and/or offset along the y-axis of the spacer layers 138 and dies 120. The spacer layers 138 may be formed of a dielectric material, such as for example silicon dioxide. The spacer layers 138 may be formed of other materials in further embodiments.

Following electrical connection of the dies 120 to the substrate 102 and each other, the semiconductor device 100 may be encapsulated in a mold compound 140 in a step 228 and as shown in FIG. 15. Mold compound 130 may include for example solid epoxy resin, Phenol resin, fused silica, crystalline silica, carbon black and/or metal hydroxide.

Other mold compounds from other manufacturers are contemplated. The mold compound may be applied by various known processes, including by compression molding, FFT (flow free thin) molding, transfer molding or injection molding techniques.

In step 230, solder balls 142 may optionally be affixed to the contact pads 110 on a lower surface of substrate 102 as shown in FIG. 15. The solder balls 142 may be used to solder the semiconductor device 100 to a host device, such as a printed circuit board.

As noted above, the semiconductor device 100 may be formed on a panel of substrates. After formation and encapsulation of the semiconductor devices 100, the devices 100 may be singulated from each other in step 232 to form a finished semiconductor device 100 as shown in FIG. 15. The semiconductor devices 100 may be singulated by any of a variety of cutting methods including sawing, water jet cutting, laser cutting, water guided laser cutting, dry media cutting, and diamond coating wire cutting. While straight line cuts will define generally rectangular or square shaped semiconductor devices 100, it is understood that semiconductor device 100 may have shapes other than rectangular and square in further embodiments of the present technology.

Figure 16:
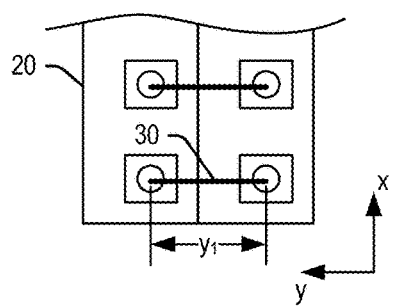
FIGS. 16 and 17 are partial top and edge views of semiconductor dies with conventional wire bonds.
Figure 17:
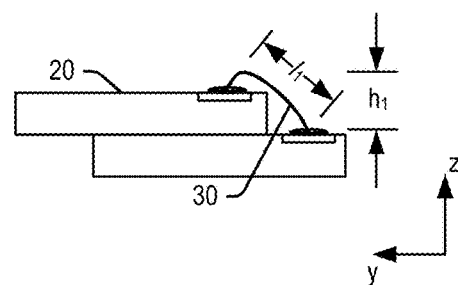

FIGS. 16 and 17 are top and edge views of conventional wire bonds 30 formed directly between two adjacent stacked semiconductor dies 20. The length, $l_1$, of the wire bond 30 is a function of the distance, $y_1$, between bond pads along the y-axis and its height, $h_1$. The distance, $y_1$, and height, $h_1$, are in turn functions of the offset between adjacent dies 20 along the y-axis, and the thickness of the dies 20. In this example, the dies 30 may for example be 36 μm thick, and the die bond pads of adjacent dies 30 may be spaced from each other along the y-axis 530 μm. In one example, this results in a wire bond 30 that is 570 μm in length, with a simulated inductance of 0.32 nH.

Figure 18:
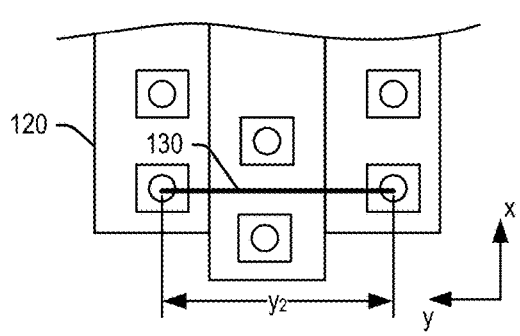
FIGS. 18 and 19 are partial top and edge views of semiconductor dies with wire bonds according to embodiments of the present technology.
Figure 19:
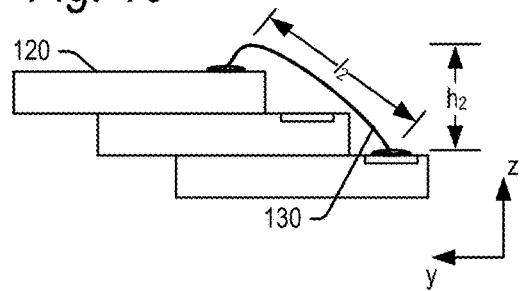

FIGS. 18 and 19 are top and edge views of wire bonds 130 formed by skipping a die 120 in accordance with the present technology. The length, $l_2$, of the wire bond 130 is a function of the distance, $y_2$, between die bond pads of alternating dies along the y-axis and its height, $h_2$. As $y_2 > y_1$, and $h_2 > h_1$, it can be seen that $l_2 > l_1$. In this example, the dies 130 may for example be 36 μm thick, and the die bond pads of alternating dies 130 may be spaced from each other along the y-axis 1060 μm. In one example, this results in a wire bond 130 that is 1138 μm in length, with a simulated inductance of 0.79 nH.

Figure 20:
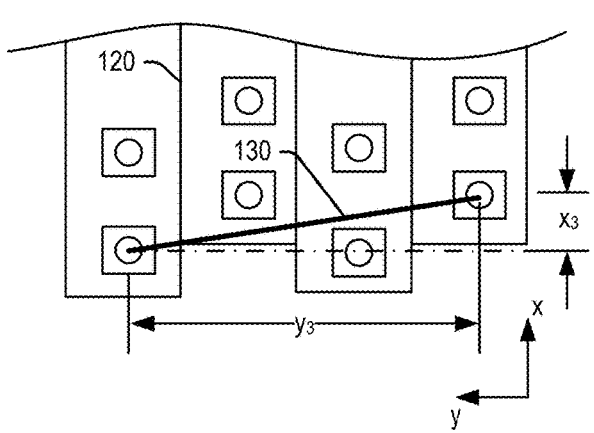
FIGS. 20 and 21 are partial top and edge views of semiconductor dies with wire bonds according to a further embodiment of the present technology.
Figure 21:
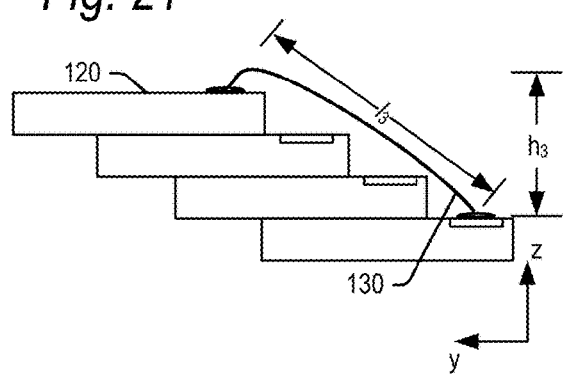
Figure 22:
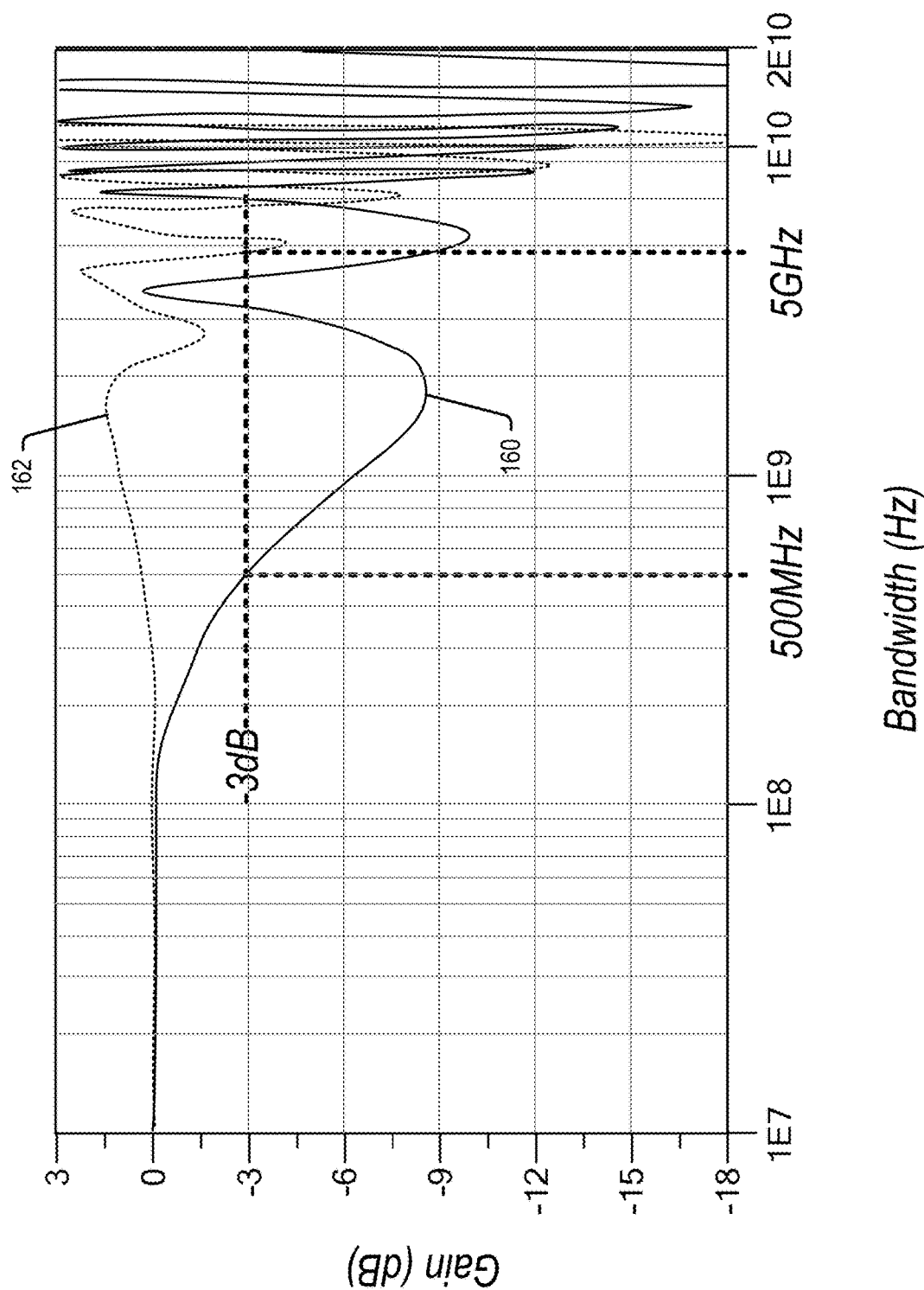
FIG. 22 is a graph illustrating the enhanced bandwidth provided by embodiments of the present technology.

FIGS. 20 and 21 are top and edge views of wire bonds 130 formed by skipping a pair of dies 120 in accordance with the present technology. The length, $l_3$, of the wire bond 130 is a function of the distance, $y_3$, between the first and fourth dies along the y-axis, the distance, $x_3$, of the offset along the x-axis, and its height, $h_3$. As $y_3 >> y_1$, $x_3 > 0$ and $h_3 >> h_1$, it can be seen that $l_3 >> l_1$. In this example, the dies 130 may for example be 36 μm thick. The die bond pads of the first and fourth dies 130 may be spaced from each other along the y-axis 1590 μm, and the die bond pads 130 may be spaced from each other along the x-axis ½ p=60 μm. In one example, this results in a wire bond 130 that is 1705 μm in length, with a simulated inductance of 1.185 nH.

In general, skipping dies in accordance with the present technology can result in bond wire 130 lengths of between 1000 μm and 2000 μm, and simulated inductances of 0.5 nH to 1.5 nH. These lengths and inductances are by way of example only and may vary outside of these ranges in further embodiments. In embodiments, for wire bonds of a given data signal channel, all but the wire bond between the two topmost dies may skip a die, and each of these wire bonds (apart from that between the two topmost dies) may be the same length. Alternatively, as shown for example in FIGS. 12 and 13, for wire bonds of a given data signal channel, some wire bonds may skip one or two dies, while other wire bonds do not skip any dies.

As noted in the Background, conventional wire bonded semiconductor packages have limited signal bandwidth due to high parasitic capacitance relative to inductance from the bond wires. In particular, the inductance generated from the wire bonds and the parasitic capacitance from each semiconductor die in semiconductor device 100 can be modeled as an electrical circuit. A characteristic impedance of such an electrical circuit (and the semiconductor device 100) may be modeled by its inductive and capacitive elements, and may be equal to or proportionate to the square root of an equivalent inductance of the inductive elements divided by an equivalent capacitance of the capacitive elements.

Optimizing for the characteristic impedance for semiconductor devices may provide for more efficient signal communication and/or improved signal quality, including increased bandwidth, frequency, and/or transmission rate. It has been found that characteristic impedance for a modeled circuit of a semiconductor device is optimized when inductance is relatively balanced with respect to parasitic capacitance and the transmission system's termination impedance. In accordance with the present technology, providing relatively long bond wires 130 by skipping semiconductor dies provides a more balanced ratio of inductance to parasitic capacitance. As a result of this increase in inductance, characteristic impedance is optimized, with a number of associated benefits.

One such benefit is improved signal bandwidth. FIG. 16 is a graph showing gain (in decibels) against signal frequency (in Hertz) of a conventional semiconductor device and a semiconductor device according to the present technology. The graph includes a plot 160 for a conventional semiconductor package having a 16-die stack with die parasitic capacitance Cp=1 pF, and bond wire inductance at 0.32 nH. The graph also includes a plot 162 for a semiconductor package according to the present technology having a 16-die stack with die parasitic capacitance Cp=1 pF, and bond wire inductance at 0.79 nH.

Using a conventional wire bond method, the maximum signal bandwidth that can be achieved is approximately 500 MHz. By contrast, skipping dies and lengthening bond wires according to the present technology extends the signal bandwidth to approximately 5 GHz. This increase in signal bandwidth according to the present technology provides a number of advantages. For example, the number of dies which may be directly bonded to each other and the substrate may be increased. Conventional package designs may have 8 dies coupled to each other and the substrate. Generally, when more than 8 dies are provided in a package, the dies are stacked in groups of 8 dies, with each group being directly wire bonded to the substrate. In accordance with the present technology, a single stack may include for example 16 dies or more, directly bonded to each other and the substrate.

Optimizing characteristic impedance for the semiconductor device 100 by providing a balance between inductance and parasitic capacitance has benefits in addition to improving bandwidth. These additional benefits may include greater frequency range and improved transmission rate. These benefits are also obtained in accordance with the present technology without adding structure or electrical components to a conventional semiconductor package. That is, the semiconductor device 100 described above may use a conventional substrate and conventional semiconductor dies mounted on the substrate. Thus, no customization of the substrate or dies is needed. The semiconductor device 100 may also be wire bonded using a conventional wire bond capillary, but according to the novel wire bond scheme described herein.

In summary, an example of the present technology relates to a semiconductor device, comprising: a plurality of semiconductor dies stacked on top of each other, the plurality of semiconductor dies including first, second and third semiconductor dies, the second semiconductor die positioned between the first and third semiconductor dies, the plurality of semiconductor dies each comprising die bond pads, the plurality of semiconductor dies stacked offset with respect to each other along a first axis so that die bond pads of each semiconductor die is left uncovered and exposed; bond wires connected to the die bond pads of the plurality of semiconductor dies, the bond wires comprising a first bond wire extending between a first die bond pad on the first semiconductor die and a first die bond pad on the third semiconductor die.

In another example, the present technology relates to a semiconductor device, comprising: a plurality of semiconductor dies stacked on top of each other, the plurality of semiconductor dies including odd numbered semiconductor dies interspersed with even numbered semiconductor dies; a plurality of bond wires connected to a first channel die bond pad on each of the plurality of semiconductor dies, the plurality of bond wires comprising: a first set of bond wires extending between the first channel die bond pads on at least some of the even numbered semiconductor dies and skipping at least one odd numbered die, and a second set of bond wires extending between the first channel die bond pads on at least some of the odd numbered semiconductor dies and skipping at least one even numbered die.

In a further example, the present technology relates to a semiconductor device, comprising: a plurality of semiconductor dies stacked on top of each other, the plurality of semiconductor dies including odd numbered semiconductor dies interspersed with even numbered semiconductor dies, the plurality of semiconductor dies being offset from each other along a first axis, and the odd numbered semiconductor dies are offset from the even numbered semiconductor dies along a second axis orthogonal to the first axis; a plurality of die bond pads on each of the plurality of semiconductor dies, the plurality of die bond pads comprising a first channel die bond pad on each of the plurality of semiconductor dies, the first channel die bond pads of the odd numbered semiconductor dies being offset along the second axis from the even numbered semiconductor dies; a plurality of bond wires connected to the first channel die bond pad on each of the plurality of semiconductor dies, the plurality of bond wires comprising: a first set of bond wires extending between the first channel die bond pads on the even numbered semiconductor dies and skipping the odd numbered dies, a second set of bond wires extending between the first channel die bond pads on the odd numbered semiconductor dies and skipping the even numbered dies, and a third set of bond wires comprising a single bond wire between the topmost odd and even numbered dies.

In another example, the present technology relates to a semiconductor device, comprising: a plurality of semiconductor dies stacked on top of each other, the plurality of semiconductor dies including odd numbered semiconductor dies interspersed with even numbered semiconductor dies; a plurality of wire bond means connected to a first channel die bond pad on each of the plurality of semiconductor dies, the plurality of wire bond means comprising: first wire bond means extending between the first channel die bond pads on at least some of the even numbered semiconductor dies and skipping at least one odd numbered die, and second wire bond means extending between the first channel die bond pads on at least some of the odd numbered semiconductor dies and skipping at least one even numbered die.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:
1. A semiconductor device, comprising:
a plurality of semiconductor dies stacked on top of each other, the plurality of semiconductor dies comprising a first group of semiconductor dies interspersed with a second group of semiconductor dies, the plurality of semiconductor dies each comprising die bond pads including a first channel die bond pad, the plurality of semiconductor dies stacked offset with respect to each other along a first axis so that die bond pads of each semiconductor die is left uncovered and exposed;
a first set of bond wires connected to the first channel die bond pads of the first group of semiconductor dies;
a second set of bond wires connected to the first channel die bond pads of the second group of semiconductor dies; and
a third set of one or more bond wire electrically coupling the first channel die bond pad of a semiconductor die from the first group of semiconductor dies with the first channel die bond pad of a semiconductor die from the second group of semiconductor dies.

2. The semiconductor device of claim 1, wherein the first channel die bond pads on the first group of semiconductor dies are aligned with each other along a second axis orthogonal to the first axis.

3. The semiconductor device of claim 1, further comprising a substrate, the plurality of semiconductor dies mounted on the substrate.

4. The semiconductor device of claim 1, wherein the first group of semiconductor dies are aligned with each other along a second axis orthogonal to the first axis.

5. The semiconductor device of claim 4, wherein the second group of semiconductor dies are offset from the first group of semiconductor dies along the second axis.

6. A semiconductor device, comprising:
a plurality of semiconductor dies stacked on top of each other, the plurality of semiconductor dies including odd numbered semiconductor dies interspersed with even numbered semiconductor dies;
a plurality of bond wires connected to a first channel die bond pad on each of the plurality of semiconductor dies, the plurality of bond wires comprising:
a first set of bond wires extending between the first channel die bond pads on at least some of the even numbered semiconductor dies and skipping at least one odd numbered die, and a second set of bond wires, offset from the first set of bond wires, extending between the first channel die bond pads on at least some of the odd numbered semiconductor dies and skipping at least one even numbered die.

7. The semiconductor device of claim 6, wherein the first set of bond wires form a first column of straight bond wires.

8. The semiconductor device of claim 7, wherein the second set of bond wires form a second column of straight bond wires parallel to the first column of bond wires.

9. The semiconductor device of claim 6, wherein the plurality of semiconductor dies are offset from each other along a first axis, and the odd numbered semiconductor dies are offset from the even numbered semiconductor dies along a second axis orthogonal to the first axis.

10. The semiconductor device of claim 9, wherein the first channel die bond pads on the even numbered semiconductor dies align with each other along the second axis.

11. The semiconductor device of claim 10, wherein the first channel die bond pads on the odd numbered semiconductor dies align with each other along the second axis.

12. The semiconductor device of claim 11, further comprising a second channel die bond pad, adjacent the first channel die bond pad, on each of the plurality of semiconductor dies.

13. The semiconductor device of claim 12, wherein the odd numbered semiconductor dies are offset from the even numbered semiconductor dies along the second axis a distance equal to one-half the distance between the first and second channel die bond pads on a semiconductor die of the plurality of semiconductor dies.

14. The semiconductor device of claim 13, wherein the plurality of bond wires comprise a first plurality of bond wires, the semiconductor device further comprising a second plurality of bond wires extending between the second channel die bond pad on immediately adjacent odd and even numbered dies in a zigzag pattern.

15. The semiconductor device of claim 14, wherein the first channel die bond pads carry data signals to and from the plurality of semiconductor dies.

16. The semiconductor device of claim 15, wherein the second channel die bond pads carry power and ground voltages to and from the plurality of semiconductor dies.

17. The semiconductor device of claim 6, further comprising a substrate, the plurality of semiconductor dies mounted on the substrate, the substrate comprising a plurality of contact pads.

18. The semiconductor device of claim 17, wherein the first channel die bond pads of the odd numbered dies are aligned with a contact pad of the plurality of contact pads along a first axis, and the first channel die bond pads of the even numbered dies are offset from the contact pad along the first axis.

19. The semiconductor device of claim 18, further comprising a wire bond between the contact pad and the first channel die bond pad of the bottommost odd numbered die.

20. The semiconductor device of claim 17, wherein the first channel die bond pads of the even numbered dies are aligned with a contact pad of the plurality of contact pads along a first axis, and the first channel die bond pads of the odd numbered dies are offset from the contact pad along the first axis.

21. The semiconductor device of claim 20, further comprising a wire bond between the contact pad and the first channel die bond pad of the bottommost even numbered die.

22. A semiconductor device, comprising:
a plurality of semiconductor dies stacked on top of each other, the plurality of semiconductor dies including odd numbered semiconductor dies interspersed with even numbered semiconductor dies, the plurality of semiconductor dies being offset from each other along a first axis, and the odd numbered semiconductor dies are offset from the even numbered semiconductor dies along a second axis orthogonal to the first axis;
a plurality of die bond pads on each of the plurality of semiconductor dies, the plurality of die bond pads comprising a first channel die bond pad on each of the plurality of semiconductor dies, the first channel die bond pads of the odd numbered semiconductor dies being offset along the second axis from the even numbered semiconductor dies;
a plurality of bond wires connected to the first channel die bond pad on each of the plurality of semiconductor dies, the plurality of bond wires comprising:
a first set of bond wires extending between the first channel die bond pads on the even numbered semiconductor dies and skipping the odd numbered dies,
a second set of bond wires extending between the first channel die bond pads on the odd numbered semiconductor dies and skipping the even numbered dies, and
a third set of bond wires comprising a single bond wire between a pair of odd and even numbered dies.

23. The semiconductor device of claim 22, wherein the first, second and third set of bond wires form first and second columns of bond wires connected at uppermost two dies that together wire bond each of the first channel die bond pads of the plurality of semiconductor dies together.

24. The semiconductor device of claim 23, wherein the first and second columns are straight and parallel to each other.

25. The semiconductor device of claim 22, further comprising a second channel die bond pad, adjacent the first channel die bond pad, on each of the plurality of semiconductor dies.

26. The semiconductor device of claim 25, wherein the odd numbered semiconductor dies are offset from the even numbered semiconductor dies along the second axis a distance equal to one-half the distance between the first and second channel die bond pads on a semiconductor die of the plurality of semiconductor dies.

27. The semiconductor device of claim 26, wherein the second channel die bond pads carry power and ground voltages to and from the plurality of semiconductor dies.

28. The semiconductor device of claim 26, wherein the plurality of bond wires comprise a first plurality of bond wires, the semiconductor device further comprising a second plurality of bond wires extending between the second channel die bond pad on immediately adjacent odd and even numbered dies in a zigzag pattern.

29. The semiconductor device of claim 28, wherein the first channel die bond pads carry data signals to and from the plurality of semiconductor dies.

* * * * *